United States Patent
Nelson et al.

(10) Patent No.: US 8,031,453 B2
(45) Date of Patent: Oct. 4, 2011

(54) INDUSTRIAL PROCESS FIELD DEVICE WITH IMPROVED BATTERY ASSEMBLY

(75) Inventors: Richard L. Nelson, Chanhassen, MN (US); James A. Johnson, Savage, MN (US)

(73) Assignee: Rosemount Inc., Eden Prairie, MN (US)

( * ) Notice: Subject to any disclaimer, the term of this patent is extended or adjusted under 35 U.S.C. 154(b) by 782 days.

(21) Appl. No.: 12/114,099

(22) Filed: May 2, 2008

(65) Prior Publication Data
US 2008/0274772 A1 Nov. 6, 2008

Related U.S. Application Data

(60) Provisional application No. 60/931,313, filed on May 22, 2007, provisional application No. 60/927,285, filed on May 2, 2007.

(51) Int. Cl.
*H02H 3/24* (2006.01)
(52) U.S. Cl. .......................... 361/93.9; 361/92
(58) Field of Classification Search ........ 361/93.7–93.9, 361/92
See application file for complete search history.

(56) References Cited

U.S. PATENT DOCUMENTS

| | | | |
|---|---|---|---|
| 1,392,096 A | 9/1921 | Wagner | 52/642 |
| 2,976,473 A | 3/1961 | Shaw et al. | 322/28 |
| 3,911,350 A | 10/1975 | Swope | 320/154 |
| 4,233,553 A | 11/1980 | Prince et al. | 320/146 |
| 4,275,344 A | 6/1981 | Mori et al. | 322/28 |
| 4,287,465 A | 9/1981 | Godard et al. | 320/101 |
| 4,315,163 A | 2/1982 | Bienville | 307/66 |
| 4,383,211 A | 5/1983 | Staler | 320/102 |
| 4,433,277 A | 2/1984 | Carollo et al. | 320/149 |
| 4,540,890 A | 9/1985 | Gangemi et al. | 307/40 |
| 4,636,706 A | 1/1987 | Bowman et al. | 322/28 |
| 5,028,859 A | 7/1991 | Johnson et al. | 320/125 |
| 5,111,131 A | 5/1992 | Somerville | 320/160 |
| 5,121,047 A | 6/1992 | Goedken et al. | 320/160 |
| 5,122,722 A | 6/1992 | Goedken et al. | 320/116 |
| 5,166,595 A | 11/1992 | Leverich | 320/139 |
| 5,229,705 A | 7/1993 | Kato | 320/148 |
| 5,270,636 A | 12/1993 | Lafferty | 320/101 |

(Continued)

FOREIGN PATENT DOCUMENTS

DE 3322278 A1 12/1984

(Continued)

OTHER PUBLICATIONS

Office Action from Russian patent application No. 2009144537 dated Feb. 4, 2011.

(Continued)

*Primary Examiner* — Danny Nguyen
(74) *Attorney, Agent, or Firm* — Christopher R. Christenson; Westman, Champlin & Kelly, P.A.

(57) ABSTRACT

An industrial process field device is provided. The device includes wireless process field device electronics disposed within the industrial process field device and at least one battery cell disposed within the industrial process field device and operably coupled to the wireless process field device electronics. A circuit is provided that senses an electrical characteristic related to the at least one cell and provides an output to a switch to decouple the at least one cell from the industrial process field device electronics in response to certain conditions. Such conditions include too much current flowing from the at least one cell; the voltage of the at least one cell being too low; or a short circuit being generated or otherwise observed.

13 Claims, 9 Drawing Sheets

U.S. PATENT DOCUMENTS

| | | | |
|---|---|---|---|
| 5,304,917 A | 4/1994 | Somerville | 320/148 |
| 5,311,112 A | 5/1994 | Creaco et al. | 320/119 |
| 5,332,927 A | 7/1994 | Paul et al. | 307/66 |
| 5,710,506 A | 1/1998 | Broell et al. | 320/145 |
| 5,717,309 A | 2/1998 | Cho | 320/125 |
| 5,929,538 A | 7/1999 | O'Sullivan et al. | 307/66 |
| 5,949,216 A | 9/1999 | Miller | 320/125 |
| 5,955,867 A | 9/1999 | Cummings et al. | 320/107 |
| 6,057,666 A | 5/2000 | Dougherty et al. | 320/104 |
| 6,194,877 B1 | 2/2001 | Judge et al. | 322/28 |
| 6,353,306 B1 | 3/2002 | Mixon | 320/160 |
| 6,414,465 B1 | 7/2002 | Banks et al. | 320/118 |
| 6,441,584 B1 | 8/2002 | Crass | 320/131 |
| 6,476,509 B1 | 11/2002 | Chen et al. | 290/1 R |
| 6,495,992 B1 | 12/2002 | Pavlovic | 320/161 |
| 6,515,456 B1 | 2/2003 | Mixon | 320/160 |
| 6,690,140 B2 | 2/2004 | Larson | 320/104 |
| 6,784,635 B2 | 8/2004 | Larson | 320/104 |
| 6,835,481 B2 | 12/2004 | Dickman et al. | 429/19 |
| 6,888,337 B2 | 5/2005 | Sawyers | 320/103 |
| 6,979,507 B2 | 12/2005 | Edlund et al. | 429/23 |
| 7,098,627 B2 | 8/2006 | Nishida | 320/159 |
| 7,112,891 B2 | 9/2006 | Johnson et al. | 320/1 A |
| 7,116,079 B2 | 10/2006 | Bayne et al. | 320/116 |
| 7,245,032 B2 | 7/2007 | Willets et al. | 290/1 A |
| 7,245,034 B2 | 7/2007 | Johnson | 290/1 A |
| 7,250,231 B2 | 7/2007 | Edlund | 429/23 |
| 7,274,975 B2 | 9/2007 | Miller | 700/295 |
| 7,538,519 B2 * | 5/2009 | Daou et al. | 320/134 |
| 7,560,907 B2 | 7/2009 | Nelson | 322/37 |
| 7,633,286 B2 * | 12/2009 | Kajita | 324/120 |
| 2002/0097031 A1 | 7/2002 | Cook et al. | 323/273 |
| 2003/0056506 A1 | 3/2003 | Cutcher | 60/398 |
| 2003/0057919 A1 | 3/2003 | Yang | 320/152 |
| 2003/0132732 A1 * | 7/2003 | Thomas et al. | 320/134 |
| 2003/0197491 A1 | 10/2003 | Harmon | 322/28 |
| 2003/0206050 A1 | 11/2003 | Huard et al. | 327/540 |
| 2003/0224833 A1 | 12/2003 | Egan et al. | 455/572 |
| 2004/0012264 A1 | 1/2004 | Burger et al. | 307/64 |
| 2005/0134047 A1 | 6/2005 | Schumacher et al. | 290/1 |
| 2005/0245291 A1 | 11/2005 | Brown et al. | 455/572 |
| 2005/0289276 A1 | 12/2005 | Karschnia et al. | 710/305 |
| 2006/0092039 A1 | 5/2006 | Saito et al. | 340/825.37 |

FOREIGN PATENT DOCUMENTS

| | | |
|---|---|---|
| DE | 3622268 C1 | 2/1988 |
| DE | 201 07 116 | 7/2001 |
| FR | 2 689 333 | 10/1993 |
| RU | 62292 U1 | 3/2007 |
| WO | WO 01/76037 A1 | 10/2001 |
| WO | WO 2004/098014 A1 | 11/2004 |

OTHER PUBLICATIONS

International Search Report and Written Opinion for international application No. PCT/US200B/006314, filed May 16, 2008.
Official Action for Russian patent application No. 2007144064, filed Apr. 28, 2006.
Singh et al., "Micropower Supply for Sensors," IEEE International Conference on Sensors, Oct. 22, 2003, p. 600-605.
Baratka et al., "50 W Photovoltaic System for Electronic Control unit," Conference Proceedings Article, Oct. 14, 1989, p. 1-3.
International Search Report and Written Opinion for international application No. PCT/US2006/016322, filed Apr. 28, 2006.
International Search Report and Written Opinion for international application No. PCT/US2008/005682, mailed Oct. 23, 2008.
Examiner's Report from Canadian patent application No. 2685525 dated Apr. 11, 2011.
Notification from the corresponding Russian patent application No. 2009144537 dated Jun. 2, 2011.

* cited by examiner

INDUSTRIAL PROCESS FIELD DEVICE WITH IMPROVED BATTERY ASSEMBLY

CROSS-REFERENCE TO RELATED APPLICATION

The present application is based on and claims the benefit of U.S. provisional patent application Ser. No. 60/931,313, filed May 22, 2007, and U.S. provisional patent application Ser. No. 60/927,285, filed May 2, 2007, the contents of which are hereby incorporated by reference in their entireties.

BACKGROUND

In many industrial process environments, combustible atmospheres are present in the environmental space surrounding industrial process field devices (also referred to herein as transmitters). A high power spark from connection or disconnection of a battery has a potential to ignite the combustible atmosphere.

In many industrial process environments, corrosive dust, liquids or mists are present which can damage electronic circuitry. Electronic circuitry is typically enclosed in a sealed electronic compartment. However, when such compartments are opened to replace a battery and then resealed, there is a potential to contaminate battery contacts or to seal corrosive chemicals inside the electronics compartment causing long term degradation of the electronics. On the other hand, batteries installed outside the transmitter housing are also subject to corrosion.

Circuits inside a transmitter typically carry enough electrical energy to spark and ignite a combustible atmosphere under accidental short circuit or fault conditions. Special precautions are thus taken before opening a transmitter electronics compartment. Either the surrounding environment is cleared of combustible vapors, the cable providing power to the transmitter is deenergized, or both. To increase safety, organizations require "hot work permits" and specially trained personnel before a transmitter is opened in an area where combustible atmospheres are sometimes present.

While cells and batteries can provide low current levels under ordinary operating conditions, batteries and cells typically produce very high short circuit currents under fault conditions. A typical fault condition is a short circuit in a circuit that is external to the cell or battery. In addition, cells and batteries have a large energy storage capacity or equivalent electrical capacitance C. The high short circuit currents under fault conditions and the large energy storage capacity are typically incompatible with intrinsically safe circuit specifications. It is thus difficult to mount cells or batteries outside from the transmitter housing and run a battery cable through a combustible atmosphere between the transmitter and the battery. Such a battery cable would typically violate intrinsically safe circuit requirements.

Similar difficulties are encountered with other types of battery powered industrial process field devices. A method and apparatus are needed for providing improved battery powered industrial process field devices that have a wide range of applicability in industrial process environments.

SUMMARY

An industrial process field device is provided. The device includes wireless process field device electronics disposed within the industrial process field device and at least one battery cell disposed within the industrial process field device and operably coupled to the wireless process field device electronics. A circuit is provided that senses an electrical characteristic related to at least one cell and provides an output to a switch to decouple at least one cell from the industrial process field device electronics in response to certain conditions. Such conditions include too much current flowing from the at least one cell; the voltage of the at least one cell being too low; or a short circuit being generated or otherwise observed.

DETAILED DESCRIPTION

Field devices, such as transmitters, used in industrial processes can be installed in the field on pipelines, tanks and other industrial process equipment. Transmitters sense process variables such as process pressure, process flow, process fluid temperature, process fluid conductivity, process fluid pH and other process variables. Other types of industrial process field devices include valves, actuators, field controllers, data displays and communication equipment such as industrial field network bridges.

Some industrial process field devices have no cabled connection to electrical power and rely on an internal battery for power. Wireless transmitters transmit outputs representing the process variables over a wireless communication channel to control or monitor equipment that is remote from the wireless transmitters. The control or monitoring equipment is typically located in a control room. The wireless transmitter typically includes an antenna used for wireless transmission with a control room antenna or other wireless network device such as a gateway. Use of wireless communication avoids connecting a communication or power cable between the transmitter and the control room.

Wireless transmitters typically include electronic circuits that require only small amounts of power for operation. The amount of power required is so low that small replaceable primary cells could be considered to provide the power. There are, however, difficult problems associated with the industrial process environment that limit general, widespread use of internal batteries in that environment.

Figure 1:
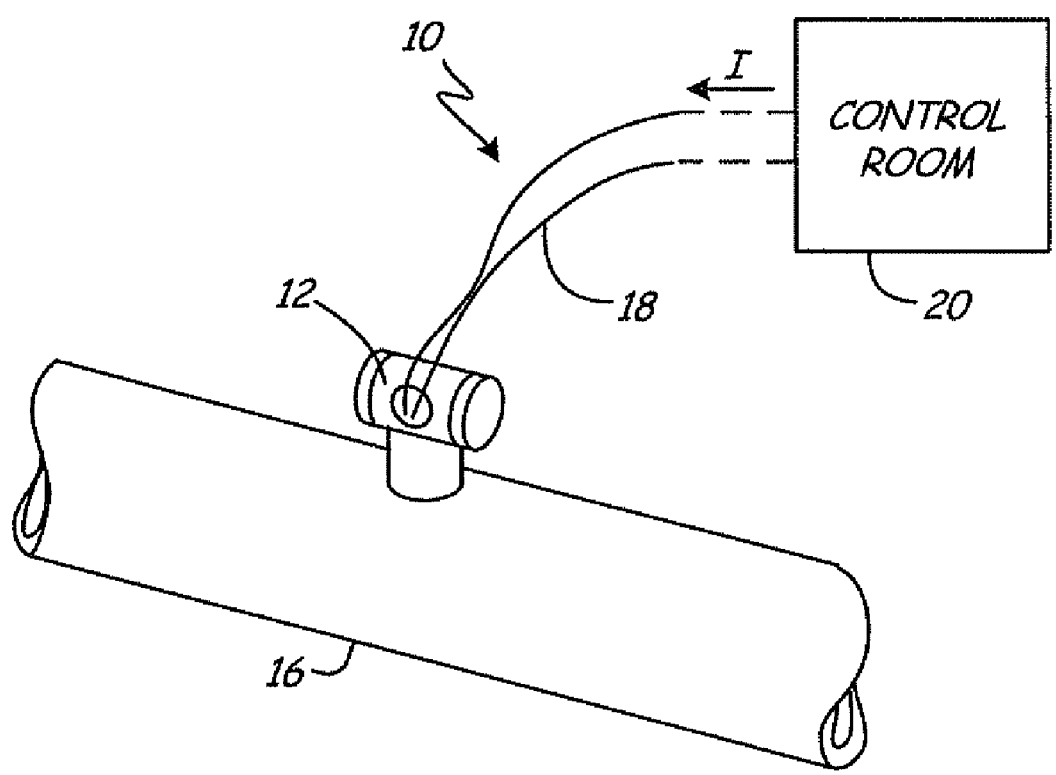
FIG. 1 illustrates a pressure transmitter mounted to a pressurized process pipe.

FIG. 1 is a diagram of process control system 10 which includes a pressure transmitter 12 connected to a pressurized process pipe 16. Pressure transmitter 12 is coupled to a two-wire process control loop 18 which operates in accordance with a desired protocol such as the HART® standard, a 4-20 milliamperes analog standard or other known process control communication standard. Two-wire process control loop 18 runs between pressure transmitter 12 and a remotely located control room 20. In an embodiment in which loop 18 operates in accordance with the HART® protocol, loop 18 can carry a current I which is representative of a sensed process pressure and which also provides all of the energization for pressure transmitter 12. In some applications, there are disadvantages to use of the two-wire process control loop 18 to energize the transmitter 12. In such applications, the wired process control loop 18 is not used, and transmitter 12 is instead energized by a cell or battery and uses wireless communication as described below.

Figure 2:
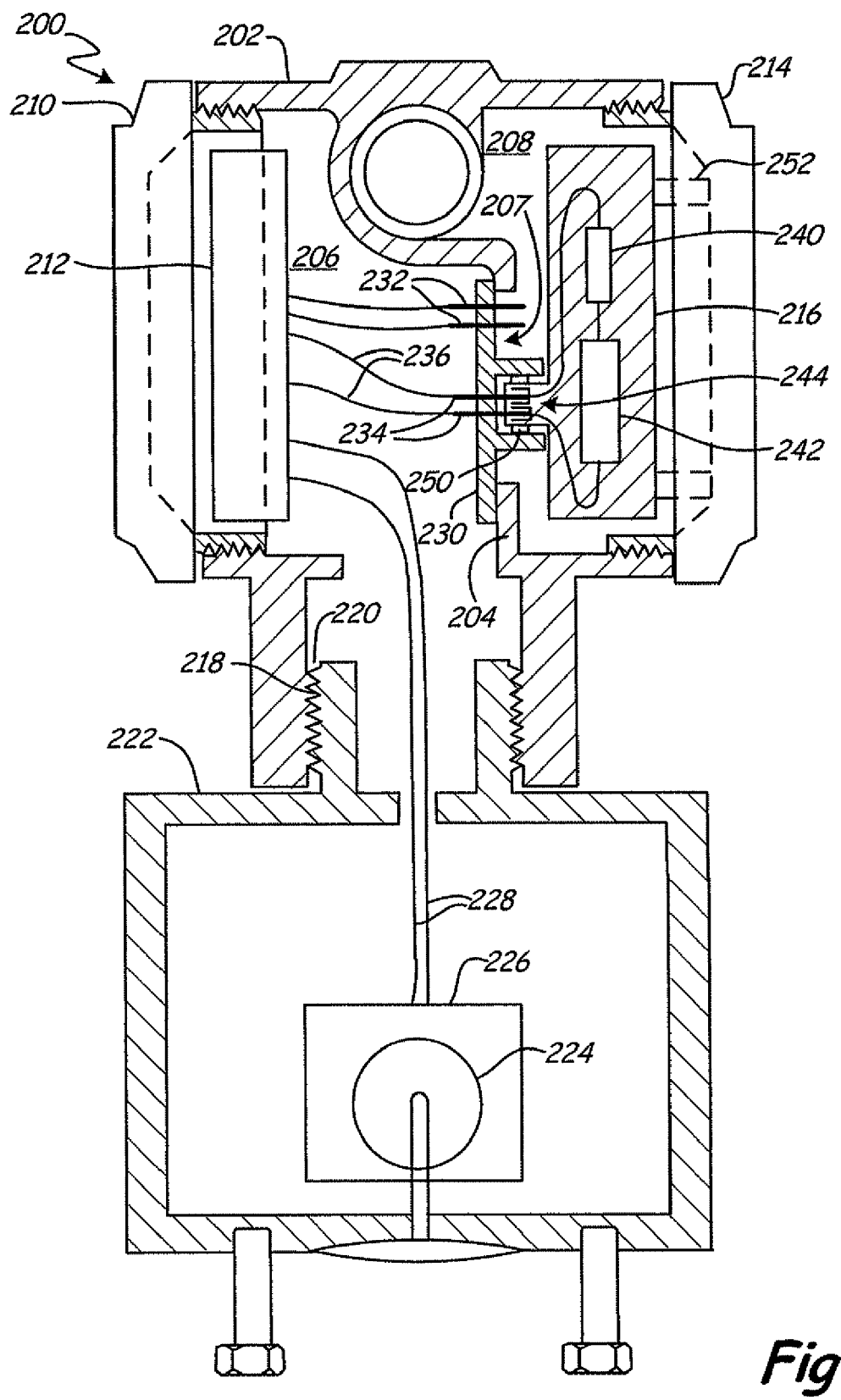
FIG. 2 illustrates a cross-sectional view of a pressure transmitter.

FIG. 2 illustrates an embodiment of an industrial process field device 200 that senses pressure. The industrial process field device 200 comprises a housing 202. The housing 202 comprises a wall 204 between an electronics compartment 206 and a battery compartment 208. The wall 204 includes a feedthrough opening 207. In this embodiment, a first housing cover 210 is generally round and has threads that screw into threads on the housing 202 to enclose industrial process instrument or field device electronics 212 in the electronics compartment 206. A second housing cover 214 is generally round and has threads that screw into threads on the housing 202 to enclose a battery assembly 216 in the battery compartment 208. Industrial process field device electronics 212 generally comprise electronic circuits that are energy limited and that have temperature, reliability and vibration resistant characteristics that make them suitable for use in monitoring and controlling industrial processes in process plants such as chemical plants, petroleum refineries and the like. The field device electronics may include communication circuitry for communicating wirelessly with a process control loop.

The housing 202 has threads 218 that thread onto threads 220 of a pressure sensor housing 222. The pressure sensor housing 222 encloses a pressure sensor 224 and sensor circuitry 226. Electrical leads 228 from sensor circuitry 226 connect to the industrial process field device electronics 212. In one embodiment, the housing 202 and the housing covers 210, 214 comprise metal die castings.

In this embodiment, a feedthrough connector 230 is mounted to the feedthrough wall 204. The feedthrough connector 230 includes sealed electrical connections 232 that preferably extend through the feedthrough wall 204. The feedthrough connector 230 includes power connectors 234 and 236 that connect power to industrial process field device electronics 212. The wall 204 and the feedthrough connector 230 seal the feedthrough opening between the battery compartment 208 and the electronics compartment 206. The battery compartment 208 can be opened in a corrosive process environment and the corrosive process environment is blocked from leaking into the electronics compartment by the feedthrough wall 204 and the feedthrough connector 230. In one embodiment, the feedthrough connector 230 comprises an injection molded plastic part that includes metal electrical connections that are molded into the plastic.

The battery assembly 216 is electrically connected to the power connectors 234 and 236. The battery assembly 216 comprises an energy limiter 240 and at least one cell 242. The energy limiter can comprise a picofuse, a fuse or an electronic circuit that limits energy. In one embodiment, the series energy limiter 240 limits energy to an intrinsic safety level at an electrical connection 244 between the battery assembly 216 and the power connectors 234 and 236. The connection 244 comprises an intrinsically safe circuit. An intrinsically safe circuit is a circuit in which no spark or thermal effect that is produced under test conditions (which include normal operations and specified fault conditions) is capable of causing ignition of a given explosive atmosphere surrounding the connection 244. The current limit of the series current limiter 240 is calculable for a particular combustible gas (such as methane) and particular circuit characteristics (such as circuit capacitance and inductance) using known methods. In one embodiment, redundant intrinsic safety protection is provided by using two energy limiters instead of a single energy limiter 240.

A seal 250 surrounds the electrical connection 244 between the battery assembly 216 and the power connectors 234 and 236. The seal 250 preferably comprises an O-ring seal that is mounted to the battery assembly 216 and that slidingly engages the feedthrough connector 230 when the battery assembly 216 is removed or installed. The cover 214 preferably engages the battery assembly 216 along a circular contact ring 252 to provide mechanical support that is especially useful in high vibration environments.

Figure 3:
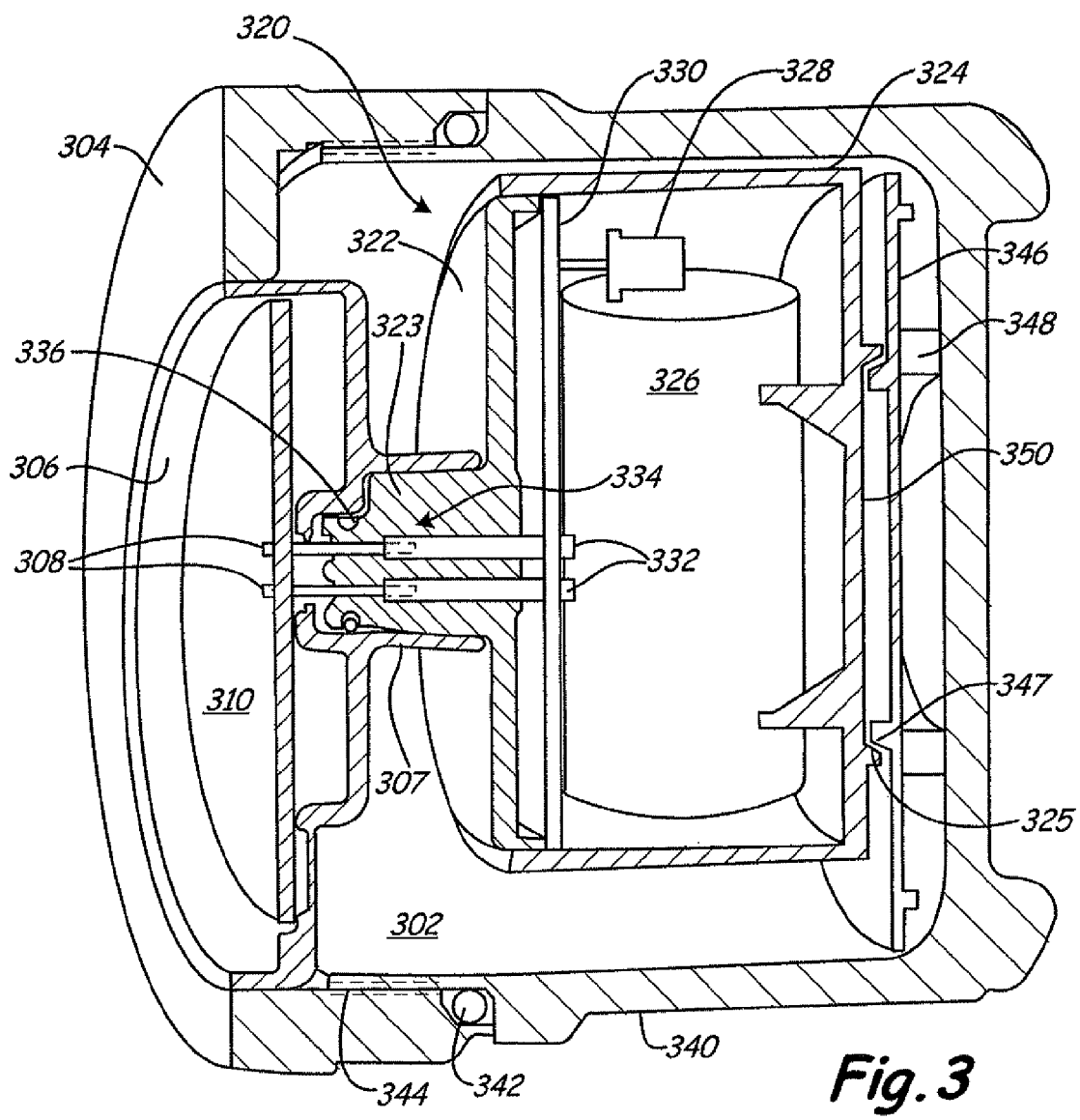
FIG. 3 illustrates a cross-sectional view of a battery compartment.

FIG. 3 illustrates a cross-sectional view of a battery compartment 302 of an industrial process field device according to one embodiment of the invention. A feedthrough wall portion of a field device housing 304 separates the battery compartment 302 from an electronics compartment. A feedthrough connector 306 is sealed to the feedthrough wall portion of instrument housing 304. Alternatively, the feedthrough connector could be integrally formed with a portion of the housing. The feedthrough connector 306 preferably comprises a plastic resin shroud and includes a sealed electrical power connector 308. The contacts of the electrical power connector are recessed in a shroud 307 to meet the IP20 per IEC 529 standard. The electrical power connector 308 is mounted to a circuit card assembly 310 in the electronics compartment. The circuit card assembly 310 is sealed to the feedthrough connector 306 around the electrical power connector 308. In one embodiment, the feedthrough connector is potted with an appropriate material.

In this embodiment, a battery assembly 320 is placed in the battery compartment 302. The battery assembly 320 comprises a housing base 322 and a housing cap 324 that enclose a cell 326 (or cells 326) and a series current limiter 328 (or multiple series current limiters 328). The housing base includes a molded connector body 323.

In one embodiment, the molded connector body 323 comprises a protruding plug that protrudes from the battery housing base 322. Electrical battery contacts 332 are recessed in the molded connector body 323 and are protected from mechanical damage during handling. The shroud 307 comprises a protruding socket that protrudes from the feedthrough connector 306. The power connector 308 comprises two pins that are recessed in the shroud 307 and are protected from mechanical damage. The engagement of the connection is a sliding connection that is easily put together or taken apart in the field after the cover 340 is removed.

Other intrinsic safety protection devices such as voltage limiting diodes can also be included in the battery assembly 320. The cell 326 and the series current limiter 328 are preferably mounted to a printed wiring board 330. The battery assembly includes electrical contacts 332 that electrically connect to the power connector 308 at an electrical connection 334. The series current limiter 328 limits energy to an intrinsic safety level at the electrical connection 334. A seal 336 surrounds the electrical connection 334.

In one embodiment, the molded connector body 323 has an external taper, and the connector on the shroud 307 has an internal taper, and there is a tapered fit between the molded connector body 323 and the connector on the shroud 307. The tapered fit is a tight fit so that vibration does not cause relative motion between the shroud 307 and the connector body 323. The tapered fit allows the battery contacts 332 to be pre-aligned with the power connector 308 while sliding the molded connector body 323 into the shroud 307. This pre-alignment prevents bending or other damage to the power connector 308.

A cover 340 preferably includes threads 344 for screwing the cover 340 to the instrument housing 304. A seal 342 seals the cover 340 to the housing 340. Inside the cover 340, a thrust bearing assembly preferably includes a thrust bearing plate 346 and a resilient compression ring 348. The thrust bearing plate 346 presses against a top surface 350 of the battery assembly housing 320. The thrust bearing plate 346 rotates relative to the top surface 350 as the cover 340 is screwed on. The compression ring 348 is compressed as the cover 340 is screwed on. The cover 340 is removably attachable to the housing 340 and presses the battery assembly 320 toward the power connector 308. The screw down cover 340 presses down on the battery assembly 320 to maintain battery assembly connection during extreme vibration. In one embodiment the thrust bearing plate 346 includes a protruding ring 347 that has a tapered fit to a ring 325 on the housing cap 324. The tapered fit eliminates relative motion between the thrust bearing plate 346 and the housing cap 324 during vibration.

Embodiments of the present invention generally include circuitry that senses one or more electrical conditions relative to the battery pack of a field device, and quickly ameliorates such conditions before they generate a fault and/or hazard.

Figure 4:
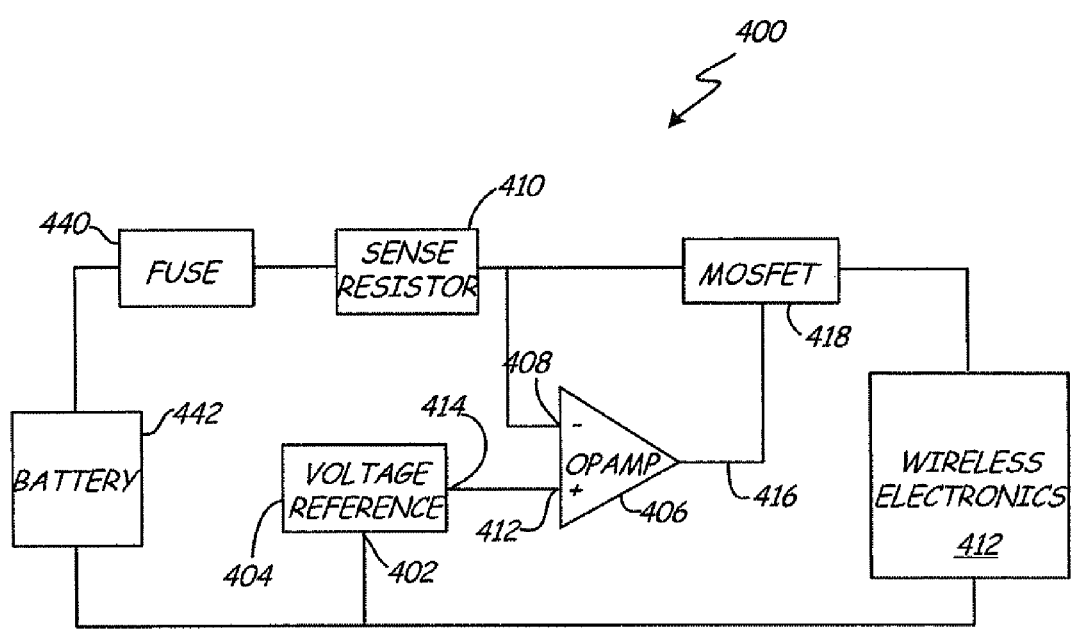
FIG. 4 is a diagrammatic view of a current limiting circuit in accordance with an embodiment of the present invention.

FIG. 4 is a diagrammatic view of a current limiting circuit in accordance with an embodiment of the present invention. Circuit 400 includes one or more battery cell(s) 442 coupled to fuse 440. Battery cell(s) 442 shares a common ground with voltage reference 404 via connection 402. Additionally, battery cell(s) 442 and voltage reference 404 share a common ground with industrial process field device wireless electronics 412. As set forth above, one or more battery cells 442 can comprise a battery pack that is replaceable in the field in a hazardous location without the need for declassifying the area or obtaining a hot work permit. Cell(s) 442 are placed in the terminal block side of the field device, and thus replacement of cell(s) 442 does not expose electronics 412 to the surrounding environment. Fuse 440 limits energy discharge from cell(s) 442. However, due to potentially high inrush currents into electronics 412, fuse 440 can inadvertently be blown when there is no real fault. This type of failure, when there is no real fault, would generally cause poor customer satisfaction with the overall product. Accordingly, the embodiment illustrated in FIG. 4 includes additional circuitry to protect fuse 440 from blowing due to transient current spikes that present no hazard. Circuit 400 includes operational amplifier 406 that has its inverting input 408 coupled to sense resistor 410. The non-inverting input 412 of operational amplifier 406 is coupled to output 414 of voltage reference 404. The voltage drop across sense resistor 410 is proportional to the current discharge from cell(s) 442 into wireless electronics 412. This voltage drop across sense resistor 410 is then compared with a fixed voltage provided by output 414 of voltage reference 404. Operational amplifier 406 provides output 416 that is coupled to metal oxide semiconductor field effect transistor (MOSFET) 418 to limit the current that wireless electronics 412 can consume to a value below the rated fuse current of fuse 440. While the embodiment illustrated in FIG. 4 includes a specific voltage reference 404, those skilled in the art will appreciate that voltage reference 404 can be replaced with a simple voltage divider comprising a pair of resistors coupled in series between the output of fuse 440 and the common ground. The connection between the resistors is then also coupled to the non-inverting input 412 of operational amplifier 406.

Figure 5:
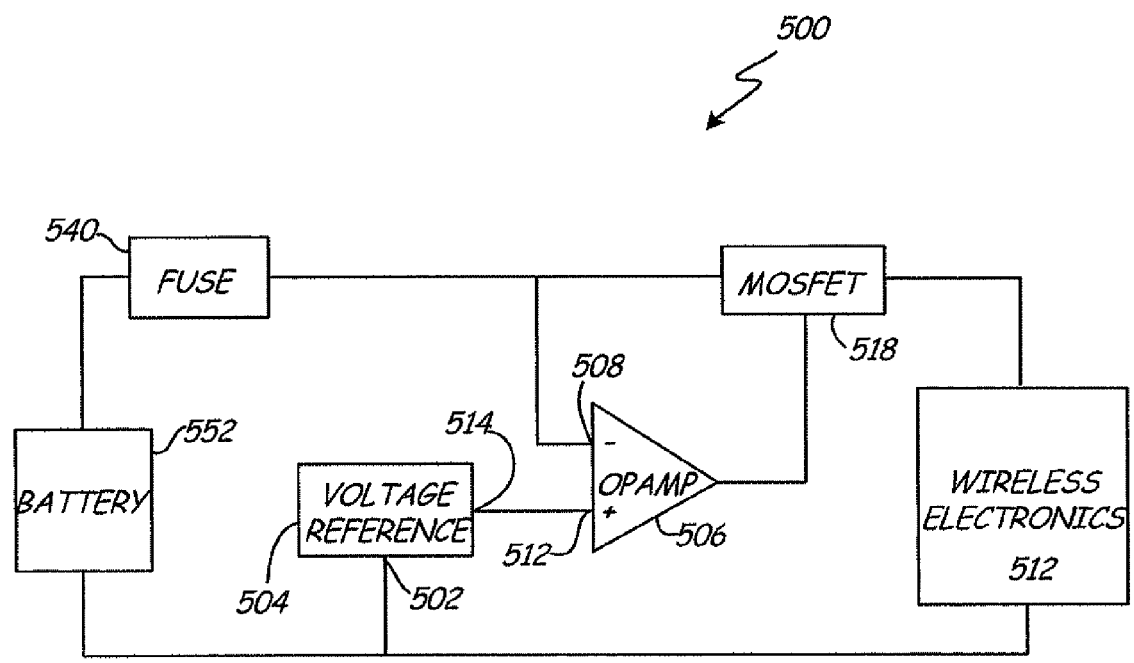
FIG. 5 is a diagrammatic view of another current limiting circuit in accordance with another embodiment of the present invention.

FIG. 5 is a diagrammatic view of another current limiting circuit in accordance with another embodiment of the present invention. Circuit 500 bears many similarities to circuit 400 (described with respect to FIG. 4) and like components are numbered similarly. Circuit 500 is different than circuit 400 in that sense resistor 410 has been eliminated. In essence, circuit 500 employs fuse 540 as the low-resistance sense resistor. Fuse 540 can be characterized and can be used as the sensing element in the comparator circuit in the same manner as that described above with respect to sense resistor 410. One benefit of the elimination of the sense resistor, in circuit 500, is that not only does the current limiting circuit protect fuse 540, it also reduces the amount of resistance between cell(s) 552 and wireless electronics 512, to just the resistance of fuse 540 alone. Depending on the wireless device, peak currents out of cell(s) 552 can be hundreds of milliamps for short durations of time. To avoid an additional voltage drops (and therefore system inefficiencies), the least amount of resistance (either in the fuse or in the sense resistor) is the best.

Figure 6:
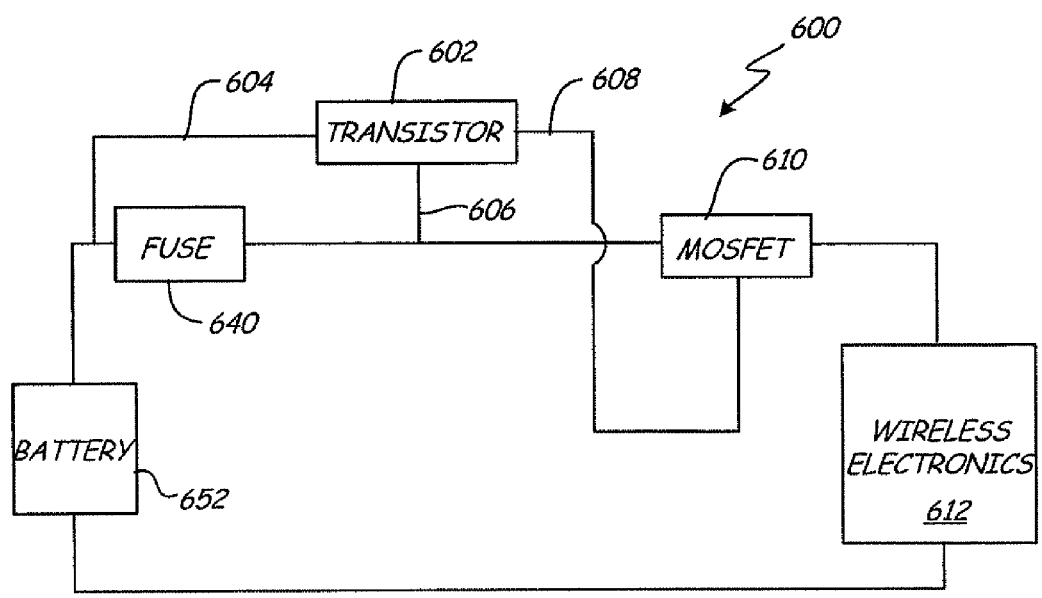
FIG. 6 is a diagrammatic view of a short-circuit protection circuit in accordance with another embodiment of the present invention.

The current limiting embodiments described above with respect to FIGS. 4 and 5 can be augmented with additional short-circuit protection. FIG. 6 is a diagrammatic view of a circuit 600 providing such short-circuit protection. Circuit 600 includes transistor 602 having a first leg 604 coupled to a first side of fuse 640, a second leg 606 coupled to the opposite side of fuse 640, and a third leg 608 coupled to the input of MOSFET 610. With circuit 600, in the event that a customer accidentally shorts the output of the battery pack, the fast acting analog circuitry, such as transistor 602 and sense resistor or fuse 640, act to protect the fuse and battery(s).

Embodiments of the present invention described thus far address the potential problems of excess current blowing the fuse and generating an undesirable experience of blowing the fuse when no real fault exists. Additionally, short-circuit protection has also been described. One additional concern for batteries that power industrial process field devices, is that as the battery voltage level becomes too low, the battery itself can overheat, and/or otherwise become damaged or do damage itself.

One battery technology that can be employed in battery packs for wireless process field transmitters is lithium-thionyl chloride (Li—SO—Cl$_2$)primary cells. This particular chemistry of primary cells offers ultra-high power density over a wide operating temperature range and ultra-low self discharge. These characteristics enable wireless devices to operate in the standard −40 to 85° Celsius operating range for several years.

To further extend battery life of wireless industrial process transmitters, multiple primary cells are used in a series, parallel, or combination series/parallel configuration. In doing so, additional precautions need to be taken to ensure that the cells are never operated in an unstable state. A fully-charged primary cell voltage is nominally around 3.6 volts. A mostly discharged primary cell should not be discharged below 2 volts per manufacturer recommendation. In the case of two series primary cells, one of the cells could deplete faster than the other, and this could potentially lead to an unstable condition where the higher voltage cells force current through the depleted cell causing the depleted cell voltage to drop below the manufacturer recommendation (2 volts) per cell lower limit. This could potentially lead to cell rupture.

In accordance with an embodiment of the present invention, an industrial process transmitter includes a battery pack that is replaceable in hazardous conditions without the need for declassifying the area or obtaining a hot work permit, wherein the battery pack includes a low voltage cutoff capability. Preferably, low-power electronics are used to cut off the voltage between the battery pack and the industrial process transmitter electronics in certain situations.

Figure 7:
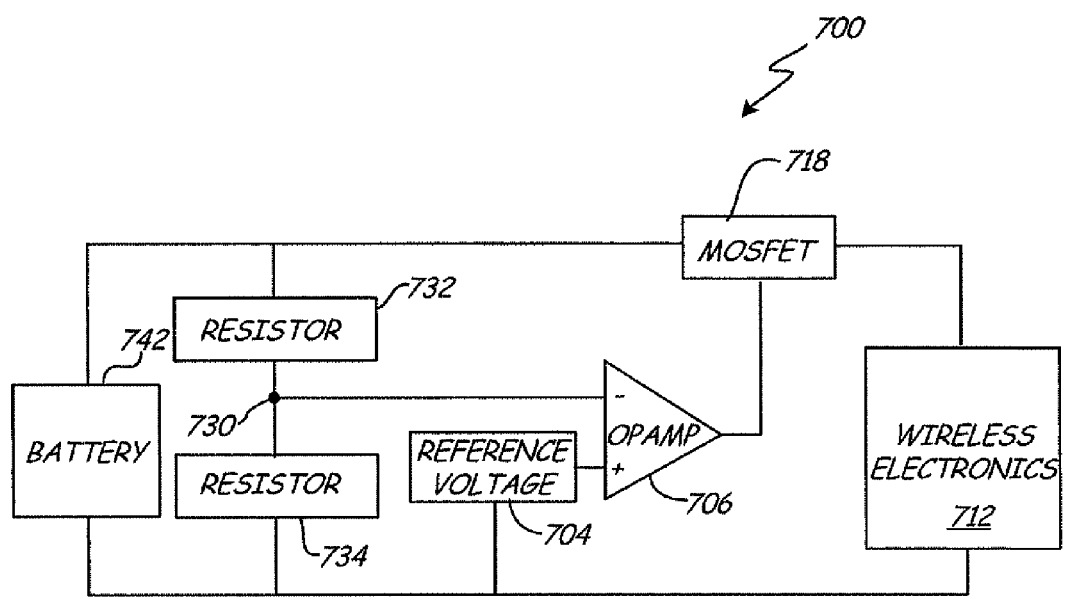
FIG. 7 is a diagrammatic view of a low-voltage cutoff circuit in accordance with an embodiment of the present invention.

FIG. 7 is a diagrammatic view of a circuit for cutting off, or otherwise de-coupling, one or more battery cells from industrial process field device electronics in certain situations. Circuit 700 bears some similarities to circuits 400 and 500, and like components are numbered similarly. As illustrated in FIG. 7, one or more battery cells 742 are operably coupled to wireless electronics 712 through MOSFET 718. operational amplifier 706 has an inverting input coupled to node 730 in the divider network comprising resistors 732 and 734. The resistor divider network formed by resistors 732 and 734 scales down the voltage from battery cell(s) 742, and this scaled voltage is then compared against a fixed voltage (reference voltage 704) with the use of a low power operational amplifier 706, or suitable a suitable comparator. The output of operational amplifier 706 is connected to a switch, such as MOSFET 718, which disconnects battery cell(s) 742 from electronics 712 when the voltage becomes too low.

Figure 8:
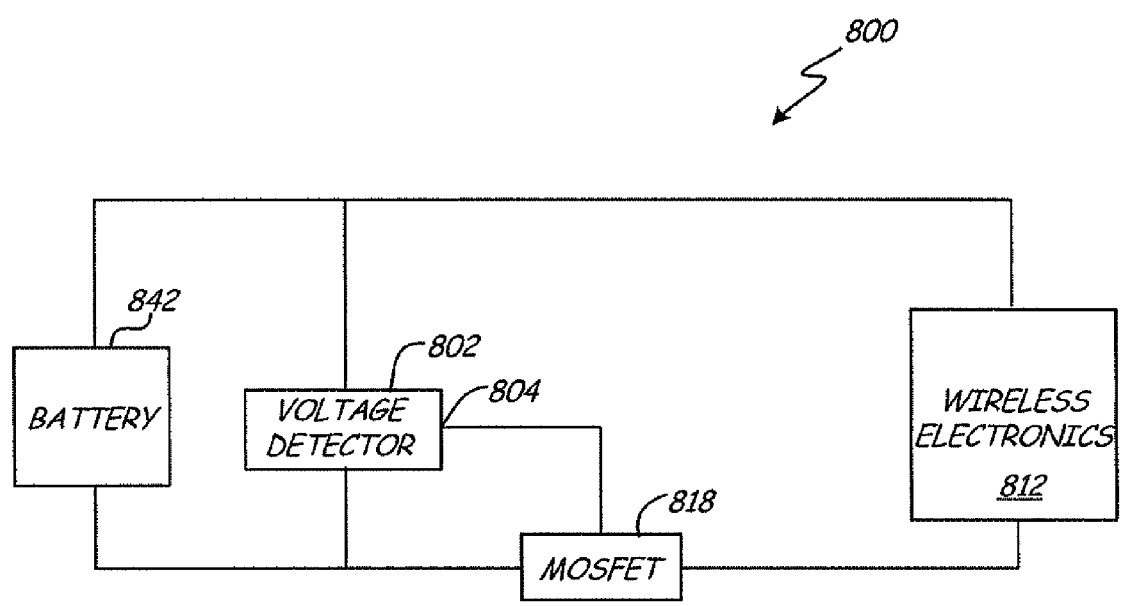
FIG. 8 is a diagrammatic view of another low-voltage cutoff circuit in accordance with another embodiment of the present invention.

FIG. 8 is a diagrammatic view of a circuit for cutting off a low-voltage battery cell(s) from industrial process field electronics when the battery voltage level is too low. Circuit 800 includes a voltage detector 802 coupled across the positive and negative polarity lines of battery cell(s) 842. Output 804 of voltage detector 802 is coupled to and controls a switch, such as MOSFET 818, which selectively couples wireless electronics 812 to battery cell(s) 842. Voltage detectors, such as detector 802, are integrated circuits that are typically used in microprocessor or microcontroller applications. They are used for situations when the voltage rails dip (also known as "brown out") below recommended operating conditions. A reset is then applied to the microprocessor or microcontroller and the reset line is then held until the battery voltage rises. Applying this "brown out" concept to embodiments of the present invention, voltage detector 802 is used in such a way as to disconnect cell(s) 842 when the battery voltage becomes too low. Voltage detectors can come with either a predetermined (fixed) detection voltage, or in with adjustable detection voltage. FIG. 8 illustrates how the voltage detector is used in conjunction with the battery pack. The battery voltage is applied to the voltage detector IC. When the battery voltage dips below the IC detection voltage, the output will disconnect the wireless electronics circuitry from the battery pack via switch 818.

Figure 9:
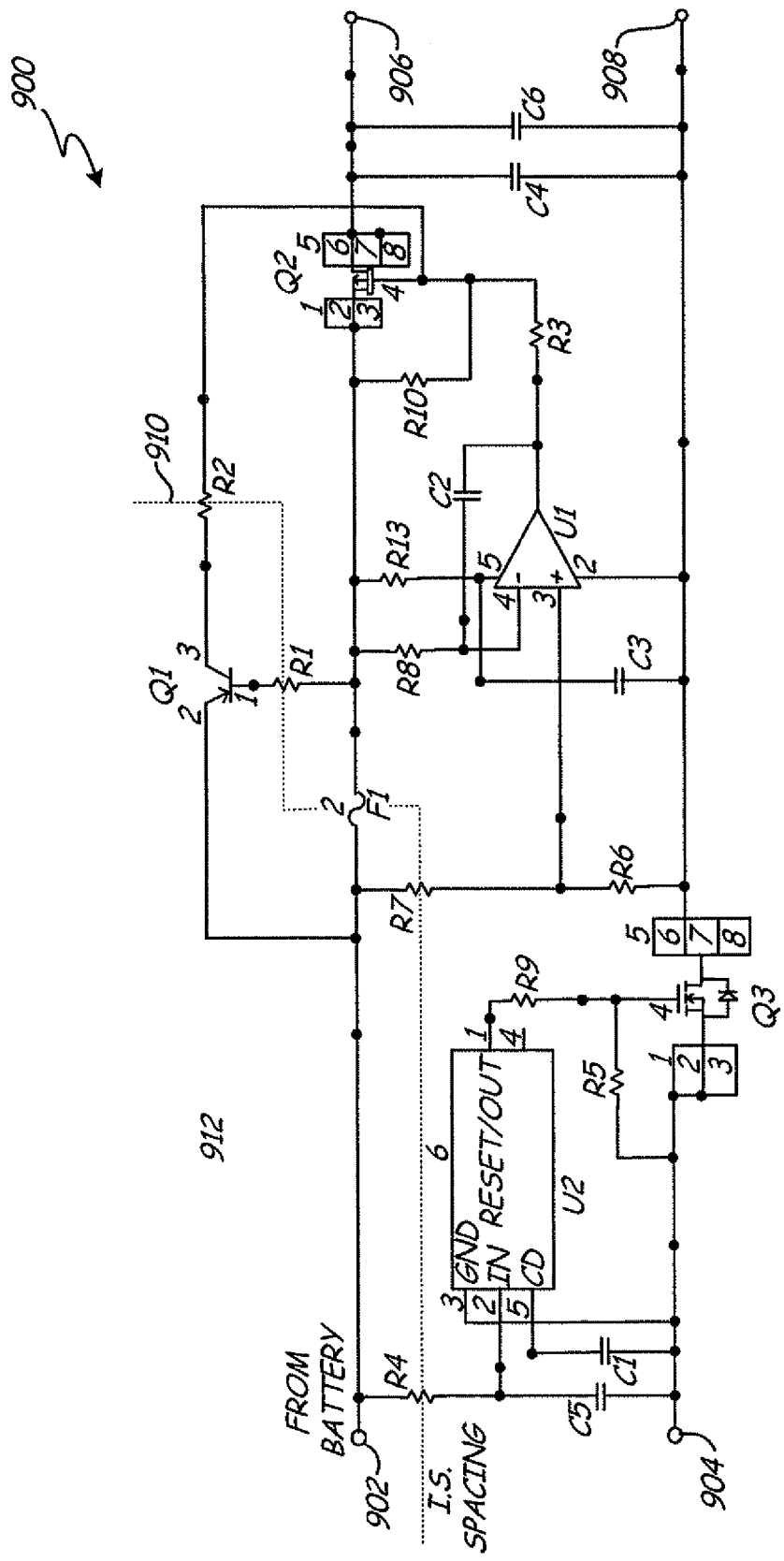
FIG. 9 is a diagrammatic view of another circuit in accordance with an embodiment of the present invention.

FIG. 9 is a diagrammatic view of one exemplary circuit in accordance with the embodiments of the present invention. Circuit 900 includes current-limiting circuitry in accordance with similar embodiments of the present invention set forth above, as well as low-voltage and short-circuit protection. Accordingly, those skilled in the art will recognize that various aspects and embodiments of the present invention can be combined in various combinations as desired. Circuit 900 includes a pair of terminals 902, 904 that are coupleable to a battery, such as one or more cells set forth with respect to previous embodiments. The output of circuit 900 is a pair of terminals 906, 908 that couple to the terminal block of an industrial process field device. As illustrated in FIG. 9, all or a portion of the circuitry for circuit 900 may be designed in accordance with intrinsic safety requirements. For example, the components within region 912 of dashed line 910 can comply with intrinsic safety requirements, for example, having minimum safety spacings of 0.020 inches between circuit traces and being disposed under a suitable coating or potting.

FIG. 9 illustrates voltage detector U2 having an input that is operably coupled to terminal 902 through resistor R4. The ground terminal of voltage detector U2 is coupled to ground terminal 904. The output pin (1) of detector U2 is coupled to switch Q3 through resistor R9. Resistor R9 preferably has a resistance of 0 ohms, or extremely low resistance, such that the output from voltage detector U2 is basically coupled directly to Q3. R5 preferably has a value of 10 megohms. Detector U2 functions to detect the battery voltage across terminals 902 and 904. If the battery voltage is at or below a threshold, determined by the voltage detector, voltage detector U2 will disengage the entire circuit by causing Q3 to open.

Circuit 900 also includes current limiting circuitry based upon the utilization of operational amplifier U1 and switch Q2. As illustrated in FIG. 9, the non-inverting input of U1 is coupled to a resistor/divider network comprising R7 and R6. The output of U1 is operably coupled, through R3, to switch Q2. In this regard, the inverting input of U1 is coupled to terminal 902 through R8. U1 compares the inputs presented at the inverting, and non-inverting inputs, and generates an output to Q2 that can disengage Q2 in such as way as to protect fuse F1 from slight non-fault transients.

FIG. 9 also illustrates circuit 900 having short-circuit protection with transistor Q1 coupled to opposite sides of fuse F1, and also coupled to switch Q2. In this way, if battery terminals 902 and 904 are short-circuited, fast acting analog circuitry such as transistor Q1, cause MOSFET Q2 to open, thereby preventing damage, or other undesirable conditions.

The specific circuit illustrated in FIG. 9 is provided as merely one example of an embodiment of the present invention. Embodiments of the present invention are not to be limited to the specific combination of features set forth in FIG. 9, or the exact arrangements thereof. That said, the actual component values used for the various elements of circuit 900 are as follows:

R1—10 k
R2—10 k
R3—100 k
R5—10 megohms
R6—10 megohms
R7—604 k
R8—604 k
R9—0
R10—10 megohms
C1—100 pF
C2—1000 pF
C3—0.010 μFarads
C4—4.7 μFarads
C5—0.010 μFarads
C6—1.0 μFarads
F1—1/16 amp fuse
Q1—part number MMBT3906 LT1
Q2—SI 9407AEY
Q3—SI 4850 EY
U1—TLV 2401 I
U2—NCM 302 LSN 40

In the embodiments described above, the battery assembly arrangement is useful with a wide variety of industrial process field devices including process control network bridges, data displays, field control valves, mechanical actuators, field controllers and transmitters. In one embodiment, the electrical cells comprise primary cells. In some embodiments, the battery assembly comprises two cells connected in series with a fuse. In one embodiment, the battery assembly is designed to have an open circuit voltage of at least 3 volts. In other embodiments, particularly single cell embodiments, open circuit voltages lower than 3 volts are used.

In one embodiment, removal of the battery is interlocked with actuation of a series switch in the battery assembly that disconnects the cells such that the power connections are not energized when the battery assembly is removed. When the switch is "on," the battery assembly cannot be disconnected. The switch can also be used to switch off the battery assembly during shipment.

Although the present invention has been described with reference to preferred embodiments, workers skilled in the art will recognize that changes may be made in form and detail without departing from the spirit and scope of the invention.

What is claimed is:

1. An industrial process field device, comprising:
   wireless process field device electronics disposed within the industrial process field device;
   at least one battery cell disposed within the industrial process field device and operably coupled to the wireless process field device electronics;
   a fuse electrically interposed between the wireless process field device electronics and the at least one battery cell, the fuse having a rated fuse current value;
   a circuit configured to measure current through the fuse and provide an output if the current exceeds a threshold below the rated fuse current value; and
   a switch coupled to the output of the circuit to decouple the at least one battery cell from the wireless process field device when the current exceeds the threshold.

2. The industrial process field device of claim 1, wherein at least a portion of the circuit is designed to meet an intrinsic safety requirement.

3. The industrial process field device of claim 2, wherein the circuit measures a voltage drop across the fuse.

4. The industrial process field device of claim 2, and further comprising a sense resistor disposed in series between the fuse and the circuit, and wherein the circuit measures a voltage from the sense resistor that is proportional to the current.

5. The industrial process field device of claim 1, wherein the circuit further includes an operational amplifier operably coupled to the fuse, a voltage reference coupled to operational amplifier, and a switch coupled the output of the operational amplifier.

6. The industrial process field device of claim 5, wherein the voltage reference has an output that provides a reference voltage to the operational amplifier.

7. The industrial process field device of claim 5, wherein the voltage reference comprises a resistor divider network.

8. The industrial process field device of claim 1, and further comprising low-voltage cutoff circuitry to decouple the at least one battery cell from the wireless process field device electronics when the battery voltage is below a threshold.

9. The industrial process field device of claim 8, and further comprising a transistor having a first leg coupled to a first side of the fuse, a second leg coupled to an opposite side of the fuse, and a third leg coupled to a switch interposed between the at least one cell and the wireless process field device electronics.

10. The industrial process field device of claim 1, and further comprising a transistor having a first leg coupled to a first side of the fuse, a second leg coupled to an opposite side of the fuse, and a third leg coupled to a switch interposed between the at least one cell and the wireless process field device electronics.

11. An industrial process field device, comprising:
    wireless process field device electronics disposed within the industrial process field device;
    at least one battery cell disposed within the industrial process field device and operably coupled to the wireless process field device electronics;
    a circuit configured to measure voltage of the at least one cell and provide an output if the voltage falls below a threshold, wherein the circuit includes an operational amplifier for comparing a plurality of inputs, and generating an output based on the comparison, wherein a first input is coupled to the voltage of the at least one battery cell, the second input is coupled to a reference voltage; and
    a switch coupled to the output of the operational amplifier to decouple the at least one battery cell from the wireless process field device electronics when the voltage falls below the threshold.

12. The industrial process field device of claim 11, wherein at least a portion of the circuit is designed to meet an intrinsic safety requirement.

13. An industrial process field device, comprising:
    wireless process field device electronics disposed within the industrial process field device;
    at least one battery cell disposed within the industrial process field device and operably coupled to the wireless process field device electronics;
    a circuit configured to measure voltage of the at least one cell and provide an output if the voltage falls below a threshold; and
    a fuse electrically interposed between the at least one battery cell and the wireless process field device electronics, and a transistor having a first leg coupled to a first side of the fuse, a second leg coupled to an opposite side of the fuse, and a third leg coupled to the switch.

* * * * *